United States Patent [19]
Farrar

[11] Patent Number: 6,077,792
[45] Date of Patent: Jun. 20, 2000

[54] METHOD OF FORMING FOAMED POLYMERIC MATERIAL FOR AN INTEGRATED CIRCUIT

[75] Inventor: Paul A. Farrar, South Burlington, Vt.

[73] Assignee: Micron Technology, Inc., Boise, Id.

[21] Appl. No.: 08/892,114

[22] Filed: Jul. 14, 1997

[51] Int. Cl.[7] .................................................. H01L 21/469
[52] U.S. Cl. ......................... 438/780; 438/781; 257/759
[58] Field of Search ..................................... 438/780, 781, 438/782; 156/155, 327; 428/209; 257/758, 759, 760

[56] References Cited

U.S. PATENT DOCUMENTS

| | | |
|---|---|---|
| 3,953,566 | 4/1976 | Gore . |
| 3,962,153 | 6/1976 | Gore . |
| 4,096,227 | 6/1978 | Gore . |
| 4,482,516 | 11/1984 | Bowman et al. . |
| 5,158,986 | 10/1992 | Cha et al. ................................... 521/82 |
| 5,173,442 | 12/1992 | Carey ....................................... 437/173 |
| 5,227,103 | 7/1993 | Muschiatti ............................. 264/45.9 |
| 5,340,843 | 8/1994 | Tsuruta et al. . |
| 5,449,427 | 9/1995 | Wojnarowski et al. . |
| 5,554,305 | 9/1996 | Wojnarowski et al. . |
| 5,591,676 | 1/1997 | Hughes et al. ........................... 437/195 |
| 5,780,121 | 7/1998 | Endo ....................................... 427/569 |
| 5,785,787 | 5/1994 | Wojnarowski et al. . |
| 5,821,621 | 10/1996 | Jeng . |
| 5,830,923 | 11/1998 | Venkataraman ........................... 521/64 |
| 5,841,075 | 11/1996 | Hanson . |
| 5,864,923 | 11/1993 | Rouanet et al. . |
| 5,879,787 | 11/1996 | Petefish . |
| 5,879,794 | 3/1995 | Korleski, Jr. . |

FOREIGN PATENT DOCUMENTS

| | | |
|---|---|---|
| 000578856 | 1/1994 | European Pat. Off. . |
| 002158995 | 11/1985 | United Kingdom . |

OTHER PUBLICATIONS

Jayaraj, K. et al., "Low Dielectric Constant Microcellular Foams", Proceedings from the 7th Meeting of the DuPont Symposium, Wilmington DE. p. 474–501 (1996), Sep. 1996.
"Electronic Materials Handbook, vol. 1 Packaging," ASM International, Materials Park OH. p. 105, 767–772 (1989).

*Primary Examiner*—Charles Bowers
*Assistant Examiner*—Evan Pert
*Attorney, Agent, or Firm*—Mueting, Raasch & Gebhardt, P.A.

[57] ABSTRACT

A method of forming an insulating material for use in an integrated circuit includes providing a substrate of the integrated circuit and forming a polymeric material on the substrate. At least a portion of the polymeric material is converted to a foamed polymeric material. The converting of the polymeric material includes exposing at least a portion of the polymeric material to a supercritical fluid. Further, an integrated circuit includes a substrate of the integrated circuit and a foamed polymeric material on at least a portion of the substrate. The integrated circuit may further include a conductive layer adjacent the foamed polymeric material. The conductive layer may be a metal line on the foamed polymeric material, or the conductive layer may be an interconnect, e.g., a contact or a via, adjacent the foamed polymeric material.

32 Claims, 8 Drawing Sheets

METHOD OF FORMING FOAMED POLYMERIC MATERIAL FOR AN INTEGRATED CIRCUIT

FIELD OF THE INVENTION

The present invention relates to the fabrication of integrated circuits. More particularly, the present invention relates to insulation materials of an integrated circuit.

BACKGROUND OF THE INVENTION

To meet demands for faster processors and higher capacity memories, integrated circuit (IC) designers are focusing on decreasing the minimum feature size within ICs. By minimizing the feature size within an IC, device density on an individual chip increases exponentially, as desired, enabling designers to meet the demands imposed on them. As the minimum feature size in semiconductor ICs decreases, however, capacitive coupling between adjacent conductive layers is becoming problematic. In particular, for example, capacitive coupling between metal lines in the metallization level of ICs limits the minimum feature size that is operatively achievable.

One attempt to minimize the problem of capacitive coupling between metal lines involves utilizing a relatively low dielectric constant material to insulate the metal lines. Conventionally, silicon dioxide ($SiO_2$), having a dielectric constant of about $4.0\epsilon_0$ (wherein $\epsilon_0$ is the permittivity of space), is used as the insulating material in ICs. To date, the minimum dielectric constant possible, however, is that of air, the dielectric constant being $1.0\epsilon_0$. Nevertheless, the use of air as an insulating material, such as provided using an air bridge, has drawbacks. For example, IC structures utilizing air insulation lack mechanical strength and protection from their environment.

$SiO_2$ and air have been utilized together in an inorganic, porous silica xerogel film in order to incorporate both the mechanical strength of $SiO_2$ and the low dielectric constant of air. In this manner, $SiO_2$ behaves as a matrix for porous structures containing air. However, porous silica xerogel film has a tendency to absorb water during processing. The water absorbed during processing is released during aging, resulting in cracking and a pulling away of the porous silica xerogel film from the substrate on which it is applied.

Even when nonporous $SiO_2$ is utilized, as the minimum feature size within an IC decreases, significant stress develops at the interface between the $SiO_2$ and metal on which $SiO_2$ is commonly formed, causing potentially detrimental disruptions in the electrical performance of the IC. For example, the stress may be great enough to rupture a metal line adjacent to the $SiO_2$ insulating layer. Such stress develops from the large difference in the coefficient of thermal expansion between that of $SiO_2$ and that of the metal. The coefficient of thermal expansion of $SiO_2$ is about 0.5 $\mu m/m°$ C. to about 3.0 $\mu m/m°$ C. The coefficient of thermal expansion of Type 295.0 aluminum, an alloy similar in composition to the aluminum alloys commonly used in the metallization level of an IC, is about 23 $\mu m/m°$ C. The coefficient of thermal expansion for aluminum is significantly higher than that of $SiO_2$. Likewise, the coefficient of thermal expansion of Type C81100 copper, an alloy similar in composition to a copper alloy which may also be used in integrated circuit metallization layers, is about 16.9 $\mu m/m°$ C., also significantly higher than that of $SiO_2$. The metallization layer's larger coefficient of thermal expansion results in its absorption of all of the strain caused by the large difference in the coefficients of thermal expansion upon heating and cooling. The result of such strain absorption is that the metallization layer is placed in tension and the $SiO_2$ layer is placed under slight compression. The high compressive yield strength of $SiO_2$ prevents its rupture. In contrast, the relatively low tensile yield strength of the metallization layer promotes its rupture, leading to integrated circuit failure.

It has also been reported that certain polymeric materials have dielectric constants less than that of $SiO_2$. For example, polyimides are known to have a dielectric constant of about $2.8\epsilon_0$ to about $3.5\epsilon_0$. The use of polyimides in the metallization level of ICs is well known. For example, Carey (U.S. Pat. No. 5,173,442) reported the use of a polyimide as an interlayer dielectric.

Others have reported that foaming (i.e., introducing air into) polymeric material results in a material having a dielectric constant of about $1.2\epsilon_0$ to about $1.8\epsilon_0$. One such foaming process is described by Cha et al. (U.S. Pat. No. 5,158,986). The exact dielectric constant of such foamed polymers depends on the percentage of voids (i.e., air) present and the dielectric constant of the polymeric material that was foamed. The use of such foamed polymers, however, has been limited to electronic packaging applications and multichip module applications for microwave substrates. Multichip module processing is not suitable for use in semiconductor fabrication because in multichip module processing, a metal insulator "sandwich" is formed as a unit and is then applied to a surface. Due to the oftentimes uneven topographies at the metallization level of an IC, each of the metal layer and the insulation layer need to be formed separately, allowing them to conform to the underlying topography.

Therefore, there is a need for an insulating material for use in an integrated circuit that has adequate mechanical integrity, as well as a relatively low dielectric constant. The capacitive coupling problem between conductive layers needs to be minimized as device density continues to increase within an integrated circuit.

SUMMARY OF THE INVENTION

A method of forming an insulating material for use in an integrated circuit in accordance with the present invention includes providing a substrate of the integrated circuit and forming a polymeric material on the substrate. At least a portion of the polymeric material is converted to a foamed polymeric material.

The step of converting the polymeric material comprises exposing at least a portion of the polymeric material to a supercritical fluid. Preferably, the supercritical fluid is carbon dioxide.

In another embodiment of the method, the step of converting the polymeric material includes converting at least a portion of the polymeric material to a foamed polymeric material having a maximum cell size of less than about 3.0 microns, a cell size of less than about 1.0 micron, and even a maximum cell size of less than about 0.1 micron.

Further, a method of fabricating an interconnect for an integrated circuit in accordance with the present invention is described. The method includes providing a substrate that includes an active area of the integrated circuit and forming a polymeric material on the substrate. At least a portion of the polymeric material is converted to a foamed polymeric material and at least one contact hole is defined in the foamed polymeric material to the active area of the integrated circuit. The contact hole is then filled with a conductive material. In much the same manner, a method of fabricating a via in the foamed polymeric material is described.

In such various methods, the polymeric material on the substrate may be an organic polymer, an organic oligomer, and an organic monomer. Preferably, the polymeric material on the substrate is an organic polymer selected from the group of a polyimide, a fluorinated polymer, and a parylene. More preferably, the polymeric material includes a polymeric material selected from the group of Type I polyimide, Type III polyimide, and Type V polyimide, or the polymeric material is a fluorinated polyimide. Most preferably, the polymeric material includes a Type I polyimide or a fluorinated Type I polyimide.

Further in accordance with the present invention, an integrated circuit is described which includes a substrate of the integrated circuit and a foamed polymeric material on at least a portion of the substrate. In various embodiments, the integrated circuit further includes a conductive layer adjacent the foamed polymeric material. The conductive layer may be a metal line on the foamed polymeric material, or the conductive layer may be an interconnect, e.g., a contact or a via, adjacent the foamed polymeric material.

DETAILED DESCRIPTION OF THE EMBODIMENTS

Figure 1A:
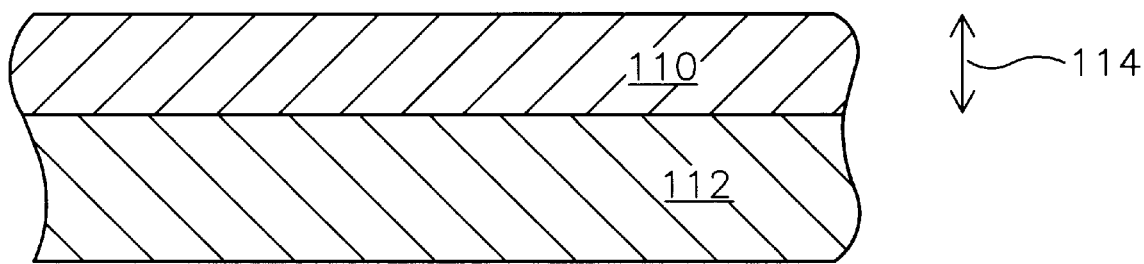
FIG. 1A is a cross-sectional representation of a substrate having polymeric material thereon.

In accordance with the present invention, foamed polymeric material is utilized as an insulating material within an integrated circuit (IC). Polymeric materials are meant to include organic polymers (i.e., materials containing 5 or more mer units having carbon chain backbones), organic oligomers (i.e., materials containing 2 to 4 mer units having carbon chain backbones), organic monomers (i.e., materials containing one mer unit having a carbon chain backbone), and materials having properties similar to those of organic polymers. For example, organic polymers are often characterized by having at least one of high ductility, a low elastic modulus (also referred to as Young's Modulus (E)), a low compressive yield strength, and a low coefficient of thermal expansion. In comparison, polymeric materials, as referred to herein, do not include brittle materials, such as ceramics, that are often characterized by their high compressive yield strength. Furthermore, polymeric materials will exhibit a tendency to flow more readily, making their application much easier than, for example, ceramic materials. Any of the above polymeric materials capable of being foamed, however, is suitable for use in accordance with the present invention.

The use of foamed polymeric material advantageously provides a lower dielectric constant insulating material within an IC relative to conventional silicon dioxide ($SiO_2$). Foamed polymeric material combines the minimal dielectric constant of air, $1.0\epsilon_0$, with the mechanical strength of the polymeric material. The polymeric material behaves as a matrix for porous structures containing air. The lower dielectric constant of such foamed polymeric material allows its advantageous use in ICs where capacitive coupling has typically been problematic. Foamed polymeric material provides relief for capacitive coupling problems.

Foamed polymeric material has many advantages. For example, unlike conventional $SiO_2$, which has a dielectric constant of about $4.0\epsilon_0$ and is used as the matrix in porous silica xerogel films, the polymeric matrix materials utilized in the porous insulating material of the present invention can have lower dielectric constants relative to that of $SiO_2$. Thus, the resulting foamed polymeric material can have a potentially lower dielectric constant than that of a porous silica xerogel film, depending on the percentage of voids within the material and the dielectric constant of the polymeric matrix material.

Furthermore, for example, foamed polymeric materials are advantageously more ductile than many other materials, such as porous silica xerogel films. The potential ductility of foamed polymeric material is due to the polymeric matrix. The polymeric matrix can be selected such that it has a high ductility. Ceramic matrix materials, such as $SiO_2$ used in porous silica xerogel film, are characterized by their lack of ductility. Foamed polymeric materials have a lesser tendency to crack and pull away from the substrate on which they are applied than do the counterpart porous silica xerogel films.

Foamed polymeric material of the present invention is advantageously utilized to insulate conductive layers, such as metal lines, within an IC. Depending on the temperatures to which the foamed polymeric material will be subjected after its formation, the foamed polymeric material can be utilized anywhere an insulating material is needed within an IC. For example, the foamed polymeric material can be utilized as a device level insulating material, as long as subsequent processing temperatures do not exceed the temperature at which the foamed polymeric material becomes unstable. At this time, processing temperatures at the device level are typically as high as about 800° C. to about 1,100° C., particularly during deposition and annealing process steps. Many conventional polymeric materials are not stable at such high temperatures. With the rapid evolution of high density IC processing, however, the use of foamed polymeric materials at the device level according to the present invention may soon be readily apparent.

In comparison, use of foamed polymeric materials as a metallization level insulating material generally assures that the material will not be subjected to high processing temperatures. At the metallization stage in the fabrication process, most of the high temperature steps have already occurred. Thus, many foamed polymeric materials are suitable for use in the metallization level because they can withstand the relatively low subsequent processing temperatures as compared to when the foamed polymeric material is used on the device level. On the device level, the foamed polymeric material may be subjected to high subsequent processing temperatures.

For the reasons stated above, preferably, the polymeric material utilized is able to withstand high subsequent processing temperatures in order to maximize the locations in which it can be utilized in an IC. Thus, preferred polymeric materials include polyimides due to their relative stability at higher temperatures. Some polyimides are able to withstand exposure to temperatures as high as 232° C. for extended periods of time. Other polyimides are able to withstand exposure to temperatures as high as 316° C. for extended periods of time. Type III polyimides have a decomposition temperature of 580° C. and a glass transition temperature above 320° C. Type I and Type V polyimides, have decomposition temperatures of 580° C. and 620° C., respectively. These materials both have glass transition temperatures above 400° C. Such characteristics are found in "The Electronic Materials Handbook—Volume 1 Packaging," ASM International, Metals Park, Ohio (1989). Polyimides may also be able to withstand exposure to higher temperatures for shorter durations. Both Type I and Type V polyimides can be exposed to temperatures up to 450° C. for about one to two hours without significant weight loss, although some out gassing may occur between 430° C. and 450° C.

There are a wide variety of suitable polyimides available. Polyimides are usually prepared by reacting a dianhydride and an aromatic diamine. The resulting polyimide is classified according to the type of dianhydride used. For example, Type I, Type III, and Type V polyimides are readily available and suitable for use in accordance with the present invention. Type I polyimide is prepared from pyromellitic dianhydride (PMDA) and oxydianiline (ODA). Type III polyimide is prepared from 4–4'-benzophenone dicarboxylic dianhydride (BTDA). Type V polyimide is prepared from biphenyl dianhydride (BPDA).

Type I polyimide has an elastic modulus of about 1.4 GPa and a coefficient of thermal expansion of about 20 $\mu$m/m° C. Type III polyimide has an elastic modulus of about 2.4 GPa and a coefficient of thermal expansion of about 40 $\mu$m/m° C. Type V polyimide has an elastic modulus of about 8.3 GPa and a coefficient of thermal expansion of about 40 $\mu$m/m° C.

Preferably, a Type I polyimide is utilized due to its relatively high ductility and relatively low coefficient of thermal expansion. Type 295.0 aluminum has an elastic modulus of about 70 GPa and a coefficient of thermal expansion of about 23 $\mu$m/m° C. Type C81100 copper has an elastic modulus of about 115 GPa and a coefficient of thermal expansion of about 16.9 $\mu$m/m° C. Thus, due to the similarities in the coefficients of thermal expansion between the Type I polyimide and the metallization layer, thermally induced stress is minimized. Furthermore, the high ductility of Type I polyimide, as shown by its low elastic modulus (about 1.4 GPa), allows it to absorb any thermally induced stress that may occur. When such polymeric material is foamed, the elastic modulus should be reduced, while the coefficient of thermal expansion should remain about the same as that of the unfoamed polymeric material.

Other suitable polymeric materials include, for example, parylene and fluorinated polymers. Parylene-N has a melting point of 420° C., a tensile modulus of 2.4 GPa, and a yield strength of 42 MPa. Parylene is based on p-xylylene and is prepared by vapor-phase polymerization.

The use of fluorinated polymers, preferably fluorinated polyimides, and more preferably fluorinated Type I polyimides have certain advantages. It is well known that the fluorine containing polymers have lower dielectric constants than similar polymers without fluorine additions. An additional advantage of the fluorine containing polymers is based on such polymers tending to be hydrophobic by nature. Such a tendency insures that even if water diffuses through the foamed polymer it will not condense in the voids so as to increase the dielectric constant of the foamed material.

Figure 1B:
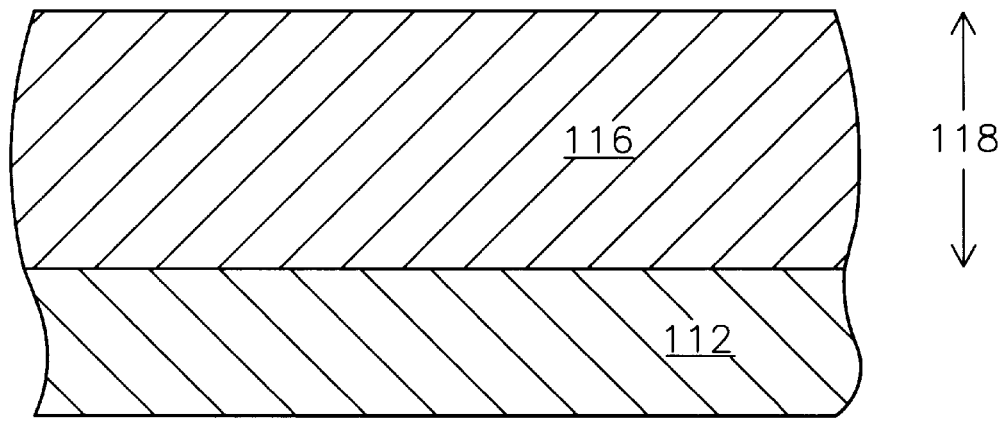
FIG. 1B is a cross-sectional representation of the substrate of FIG. 1A, wherein the polymeric material of FIG. 1A has been converted to foamed polymeric material.
Figure 1C:
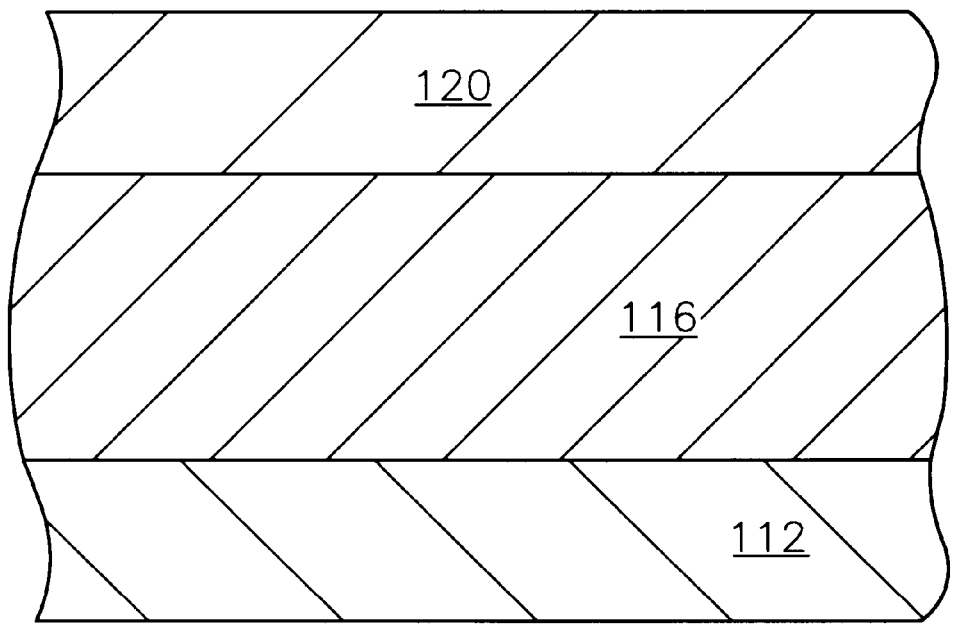
FIGS. 1C through 1F are cross-sectional representations of intermediate and resulting structures, wherein the foamed polymeric material of FIG. 1B is optionally patterned.

FIGS. 1A to 1C illustrate general process steps utilized to form a foamed polymeric material on a substrate. First, the substrate can optionally be placed in a low temperature furnace for a dehydration bake (e.g., about 30 minutes at about 150° C.) in order to remove residual moisture on the surface of the substrate.

In order to form a foamed polymeric insulation layer in an IC, a polymeric material 110 is applied to the substrate 112, as illustrated in FIG. 1A. The term substrate, as used herein, refers to any semiconductor-based structure. Substrate includes silicon wafers, silicon-on-sapphire (SOS) technology, silicon-on-insulator (SOI) technology, doped and undoped semiconductors, epitaxial layers of silicon supported by a base semiconductor, as well as other semiconductor-based structures well known to one skilled in the art. Furthermore, when reference is made to a substrate in the following description, previous process steps may have been utilized to form regions/junctions in the semiconductor-based structure previously formed. The process steps may have been used to form any number of layers or other material structures. In one embodiment of the invention, the substrate will include a metallization layer, such as aluminum or an aluminum alloy (e.g., aluminum alloyed with copper and/or silicon).

A wide variety of methods are available for applying the polymeric material 110 to the substrate 112. For example, spin-on coating, spraying, and dipping may be utilized to apply polymers to the substrate 112. Furthermore, a combination of such application techniques or any other techniques known to one skilled in the art may be used. The thickness of the layer of polymeric material 110, as indicated by arrow 114, is adjusted according to the desired thickness of the resulting foamed polymeric material, taking into account the foam expansion rate of the foaming process utilized. For example, the thickness of the layer of polymeric material may be in the range of about 0.1 microns to about 1.0 microns. The thickness of the resulting foamed polymeric material should be such that it provides adequate electrical insulation without preventing a decrease in the minimum achievable feature size of the IC. For many applications, a foamed polymeric material thickness of about 0.7 micron to about 2.1 microns is sufficient to provide adequate electrical insulation. Foamed polymer thicknesses above 2.1 microns may be desirable where metal thicknesses above 2.0 microns are used. Such foamed polymeric thicknesses may range from about 0.2 microns up to about 10.0 microns or even more. Depending on the application, however, the thickness of the polymeric material 110 is adjusted according to these criteria and known methods for controlling the thickness of applied polymeric material 110 using those techniques. For example, when utilizing spin-on coating, the thickness can be varied by adjusting the rotational speed and/or the acceleration of the spinner.

After the polymeric material 110 is applied to the substrate 112, an optional low temperature bake can be done to drive off most of the solvents present in the polyimide. Next, the polymeric material 110 is cured, if needed. In the case of an organic polymer, cured typically means that the polymeric material develops a large number of cross-links between polymer chains. Techniques for curing polymers are well known to one skilled in the art and any number of curing methods may be suitable for the processing described herein. For example, many conventional polymers can be cured by baking them in a furnace (e.g., about a 350° C. to about a 500° C. furnace) or heating them on a hot plate. Other conventional polymers can be cured by exposing them to visible or ultraviolet light. Still other conventional polymers can be cured by adding curing (e.g., cross-linking) agents to the polymer. It is preferred, when using Type I polymers, to use a multiple step cure to achieve maximum effectiveness. For example, such a multiple step cure may include processing in the range of about 100° C. to about 125° C. for about 10 minutes, about 250° C. for about 10 minutes, followed by about 375° C. for about 20 minutes. It should be readily apparent to one skilled in the art that the times and temperatures may vary depending upon various factors, including the desired properties of the materials used, and that the present invention is in no manner limited to the illustrative multiple step cure presented above. Various multiple step curing methods may be suitable. Preferably, hot plate curing is used.

A supercritical fluid is then utilized to convert at least a portion of the polymeric material 110, as illustrated in FIG. 1A, into a foamed polymeric material 116 having a thickness 118, as illustrated in FIG. 1B. A gas is determined to be in a supercritical state (and is referred to as a supercritical fluid) when it is subjected to a combination of pressure and temperature so that its density approaches that of a liquid (i.e., the liquid and gas state coexist). A wide variety of compounds and elements can be converted to the supercritical state in order to be used to form the foamed polymeric material 116.

Preferably, the supercritical fluid is selected from the group of ammonia ($NH_3$), an amine ($NR_3$), an alcohol (ROH), water ($H_2O$), carbon dioxide ($CO_2$), nitrous oxide ($N_2O$), a noble gas (e.g., He, Ne, Ar), a hydrogen halide (e.g., hydrofluoric acid (HF), hydrochloric acid (HCl), hydrobromic acid (HBr)), boron trichloride ($BCl_3$), chlorine ($Cl_2$), fluorine ($F_2$), oxygen ($O_2$), nitrogen ($N_2$), a hydrocarbon (e.g., dimethyl carbonate ($CO(OCH_3)_2$), methane ($CH_4$), ethane ($C_2H_6$), propane ($C_3H_8$), ethylene ($C_2H_4$), etc.), a fluorocarbon (e.g., $CF_4$, $C_2F_4$, $CH_3F$, etc.), hexafluoroacetylacetone ($C_5H_2F_6O_2$), and combinations thereof. Although these and other fluids may be used, it is preferable to have a fluid with a low critical pressure, preferably below about 100 atmospheres, and a low critical temperature of at or near room temperature. Further, it is preferred that the fluids be nontoxic and nonflammable. Likewise, the fluids should not degrade the properties of the polymeric material used. Most preferably, however, the supercritical fluid is $CO_2$, due to the relatively inert nature of $CO_2$, with respect to most polymeric materials. Furthermore, the critical temperature (about 31° C.) and critical pressure (about 7.38 MPa, 72.8 atm) of $CO_2$ are relatively low. Thus, when $CO_2$ is subjected to a combination of pressure and temperature above about 7.38 MPa (72.8 atm) and about 31° C., respectively, it is in the supercritical state.

The structure illustrated in FIG. 1A, is exposed to the supercritical fluid for a sufficient time period to foam at least a portion of the polymeric material 110 to the desired resulting thickness 118, as illustrated in FIG. 1B. Generally, the substrate 112 is placed in a processing chamber and the temperature and pressure of the processing chamber are elevated above the temperature and pressure needed for creating and maintaining the particular supercritical fluid. After the polymeric material 110 is exposed to the supercritical fluid for a sufficient period of time to saturate the polymeric material 110 with supercritical fluid, the flow of supercritical fluid is stopped and the processing chamber is depressurized. Upon depressurization, the foaming of the polymeric material occurs as the supercritical state of the fluid is no longer maintained.

The foaming of a particular polymeric material may be assisted by subjecting the material to thermal treatment, e.g., a temperature suitable for assisting the foaming process but below temperatures which may degrade the material. Further, the depressurization to ambient pressure is carried out at any suitable speed, but the depressurization must at least provide for conversion of the polymeric material before substantial diffusion of the supercritical fluid out of the polymeric material occurs. Foaming of the polymeric material occurs over a short period of time. The period of time that it takes for the saturated polymeric material to be completely foamed depends on the type and thickness of the polymeric material and the temperature/pressure difference between the processing chamber and ambient environment. The specific time, temperature, pressure combination used depends on the diffusion rate of the gas through the polymer and the thickness of the layer of polymer used. It should be readily apparent that other foaming techniques may be used in place of or in combination with that described herein in accordance with the present invention. Foams may also be formed by use of block co-polymers as described in "Low Dielectric Constant Polyimides and Polyimide Nanofoams," by R. D. Miller et al., *Proceedings From the Seventh Meeting of the Dupont Symposium on Polyimides in Microelectronics,* Wilmington, Del., Sep. 16–18, 1996. However, use of such co-polymers have the disadvantage in that the chemical reaction must be initiated and controlled on the surface of the semiconductor wafer.

The foamed polymeric material 116, as illustrated in FIG. 1B, is readily characterized by the number and size of cells distributed therein. Cell, as used herein, refers to an enclosed region of air. The size of a cell is determined by the nominal diameter of the enclosed region of air. Preferably, the size of cells according to the present invention is no greater than about 3.0 microns. More preferably, the size of cells according to the present invention is less than about 1.0 micron. In some applications, the size of cells according to the present invention is below 0.1 micron. It is desirable to have small cell sizes so that the foamed polymeric material 116 can be utilized in extremely small spaces. For example, as device density increases along with minimization in feature sizes, the space between metal lines in the metallization level is becoming increasingly small. This is the reason that capacitive coupling occurs between such metal lines. In order to meet the demand for high density ICs with minimal feature sizes, it is necessary that foamed polymeric material 116 be able to be formed in such small dimensions. As long as the maximum cell size of the foamed polymeric material is smaller than the minimum distance between metal lines, foamed polymeric materials provide adequate electrical insulation without a potentially detrimental reduction in mechanical integrity.

Figure 1D:
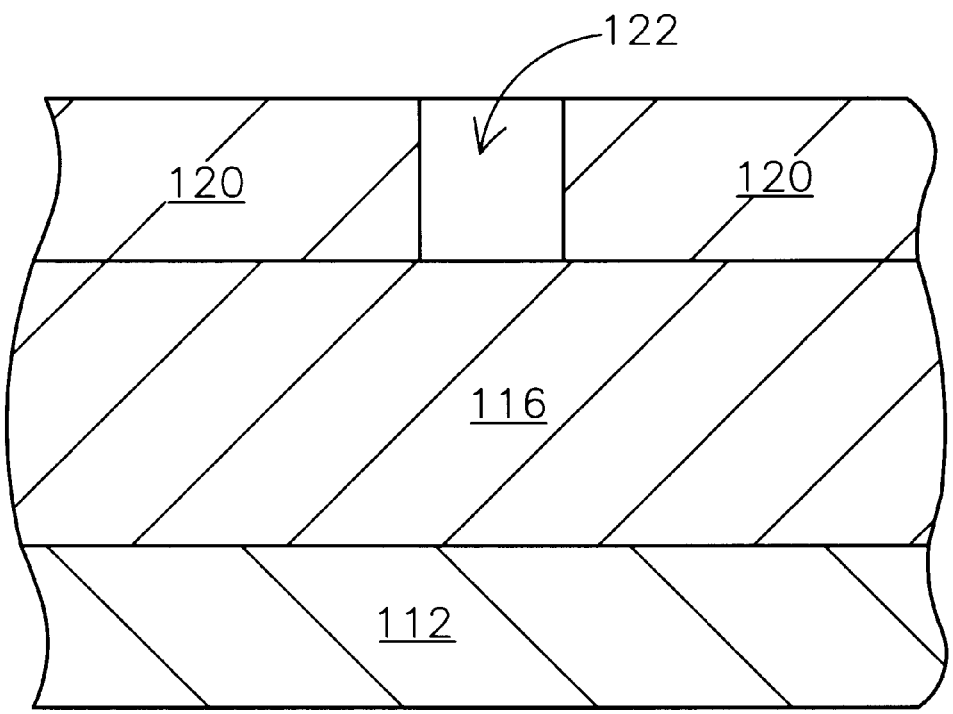
Figure 1E:
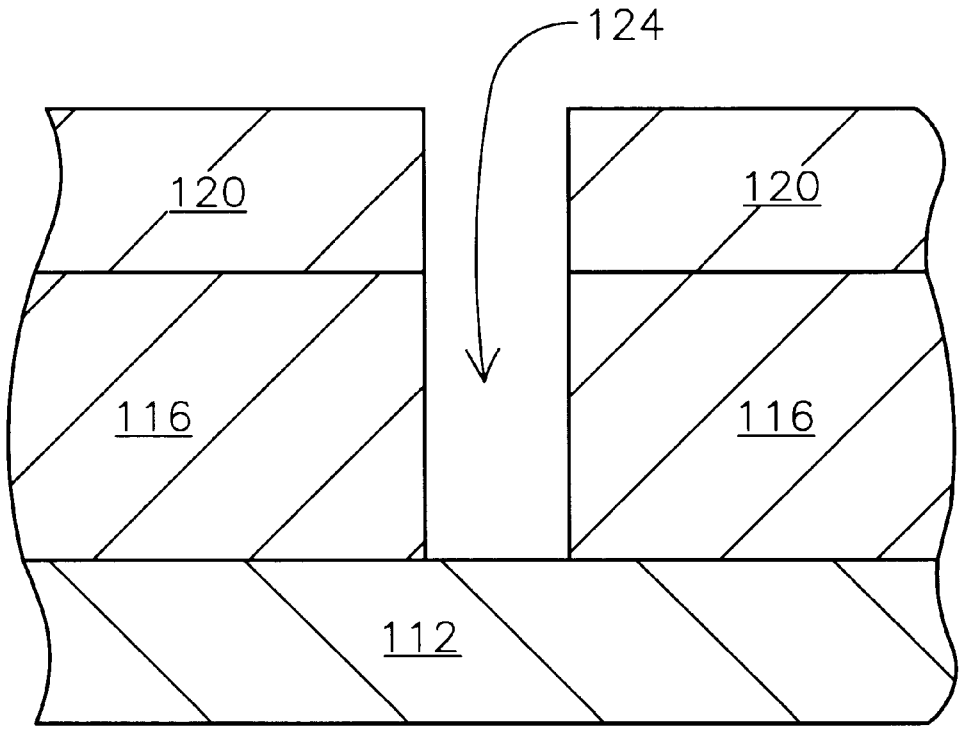
Figure 1F:
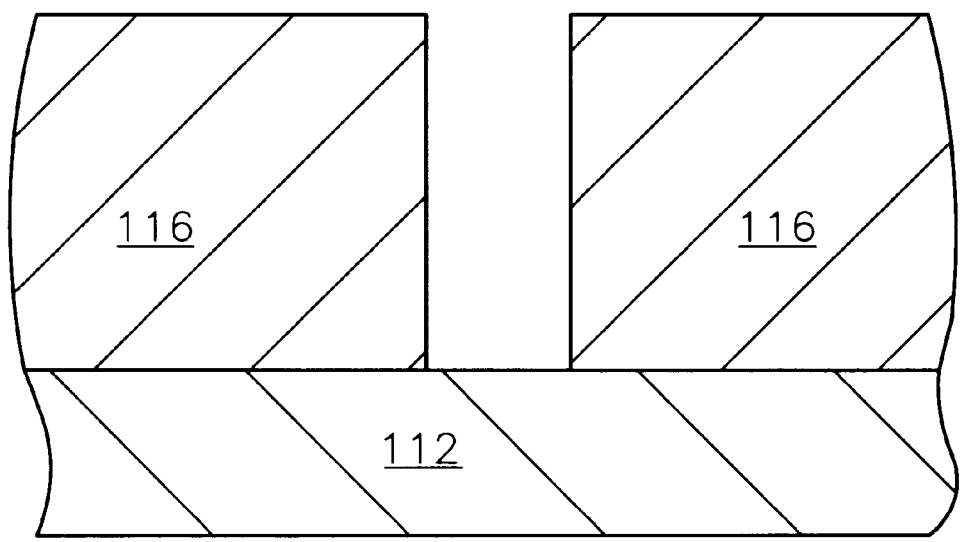

The foamed polymeric material 116 can be patterned by conventional photolithography and etching processes, if desired. Such optional processing steps are illustrated in FIGS. 1C–1F. First, as illustrated in FIG. 1C, a resist layer 120 (e.g., photoresist) is coated on the foamed polymeric material 116, as well known to one skilled in the art. Next, the resist layer 120 is exposed (e.g., utilizing photolithography) and developed, as well known to one skilled in the art, resulting in a patterned layer including resist 120 and throughholes 122 to the underlying foamed polymeric material 116, as illustrated in FIG. 1D. The foamed polymeric material 116 is then etched using suitable etch chemistries for the type of polymeric material. For example, most organic polymers can be etched using an oxygen plasma. The etched structure is illustrated in FIG. 1E, wherein a throughhole 124 extends through the foamed polymeric material 116 to the underlying substrate 112. Then, as illustrated in FIG. 1F, the resist layer 120, illustrated in FIG. 1E, is removed by use of standard photoresist removal methods, such as wet resist stripping agents. Subsequent processing steps, if any, are then performed, as well known to one skilled in the art of semiconductor processing.

A more specific use of the present invention is illustrated by way of FIGS. 2A–2E. FIGS. 2A–2E illustrate the use of dual damascene metallization process with foamed polymeric material as the insulating interlayer dielectric material. Cronin et al. (U.S. Pat. No. 4,962,058) discusses the dual damascene process in more detail than what will be provided herein. The specific use illustrated in FIGS. 2A–2E is the dual damascene metallization of a transistor. The application of the foamed polymeric material of the present invention, however, is not meant to be limited to the dual damascene metallization of transistor devices. Many devices, such as memory cells and capacitors, can be metallized using such a dual damascene process with a foamed polymeric material as the interlayer dielectric.

Figure 2A:
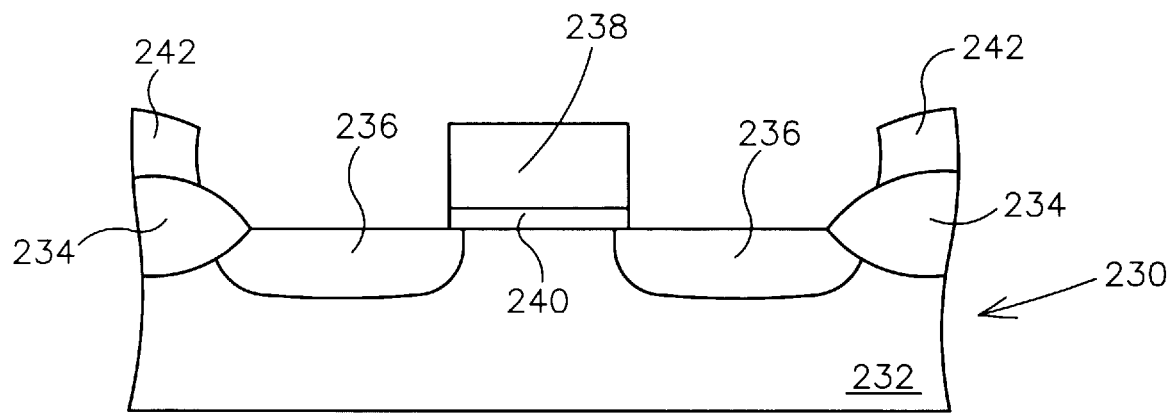
FIG. 2A is a cross-sectional representation of a substrate.

As illustrated in FIG. 2A, a substrate 230 is conventionally processed up to the point where the first level of interconnection metal is to be formed and will not be described in detail herein. The first level of interconnection metal is typically termed the contact because it connects the first metal line to an active area on an underlying device. In FIG. 2A, the device is a transistor. The transistor is laterally isolated on a doped silicon wafer 232 by field oxide 234. Implanted source/drain regions 236 are formed in the doped silicon wafer 232 on either side of a gate 238 and gate oxide 240 stack. Patterned polysilicon 242 typically remains on the field oxide 234 from the gate 238 patterning step.

Figure 2B:
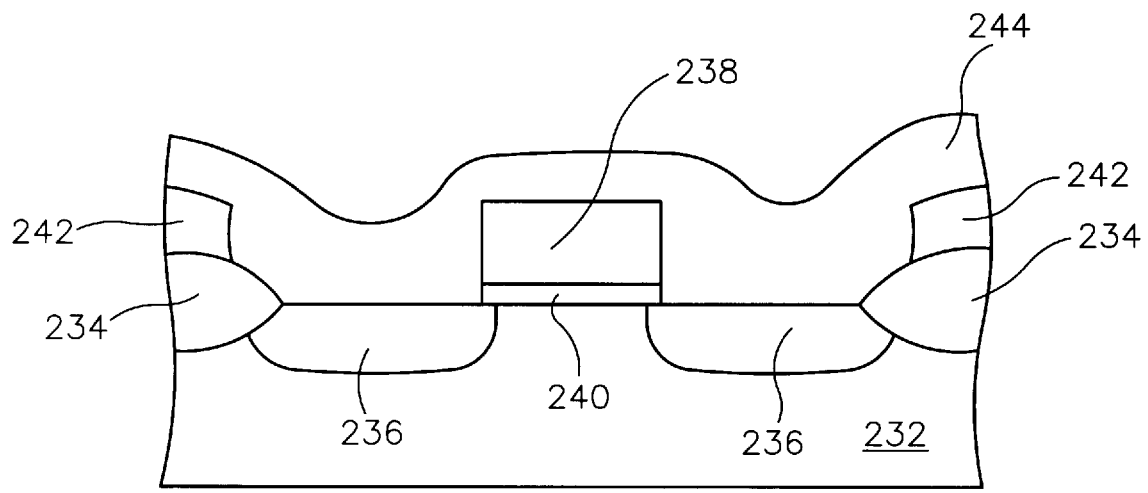
FIG. 2B is a cross-sectional representation of the substrate of FIG. 2A, wherein a polymeric material is formed thereon.
Figure 2C:
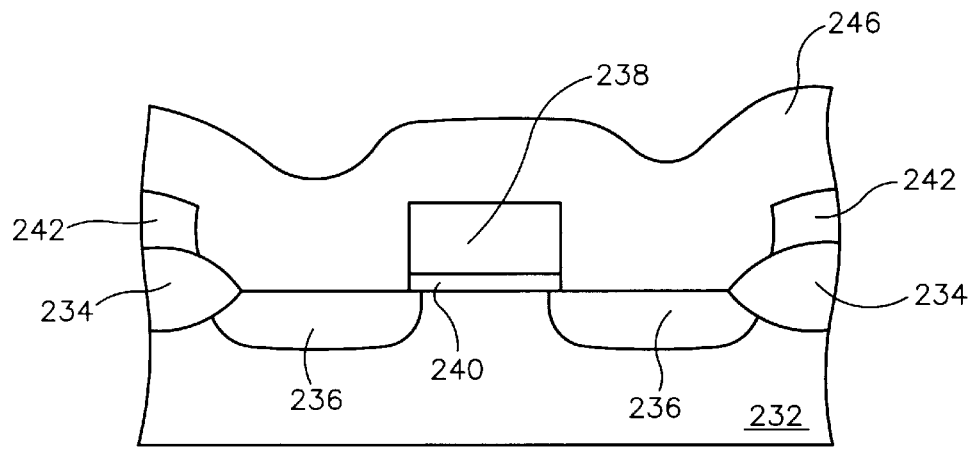
FIG. 2C is a cross-sectional representation of the structure of FIG. 2B, wherein the polymeric material is foamed.

As illustrated in FIG. 2B, a layer of polymeric material 244 is then applied to the substrate 230 illustrated in FIG. 2A. At least a portion of the polymeric material 244 illustrated in FIG. 2B is then converted to a foamed polymeric material 246 as illustrated in FIG. 2C. The technique for converting the polymeric material 244 to a foamed polymeric material 246 was described previously with respect to FIGS. 1A–1B. At this point, the foamed polymeric material may be planarized using known planarization methods, such as using etch back techniques or more preferably chemical mechanical planarization techniques.

Figure 2D:
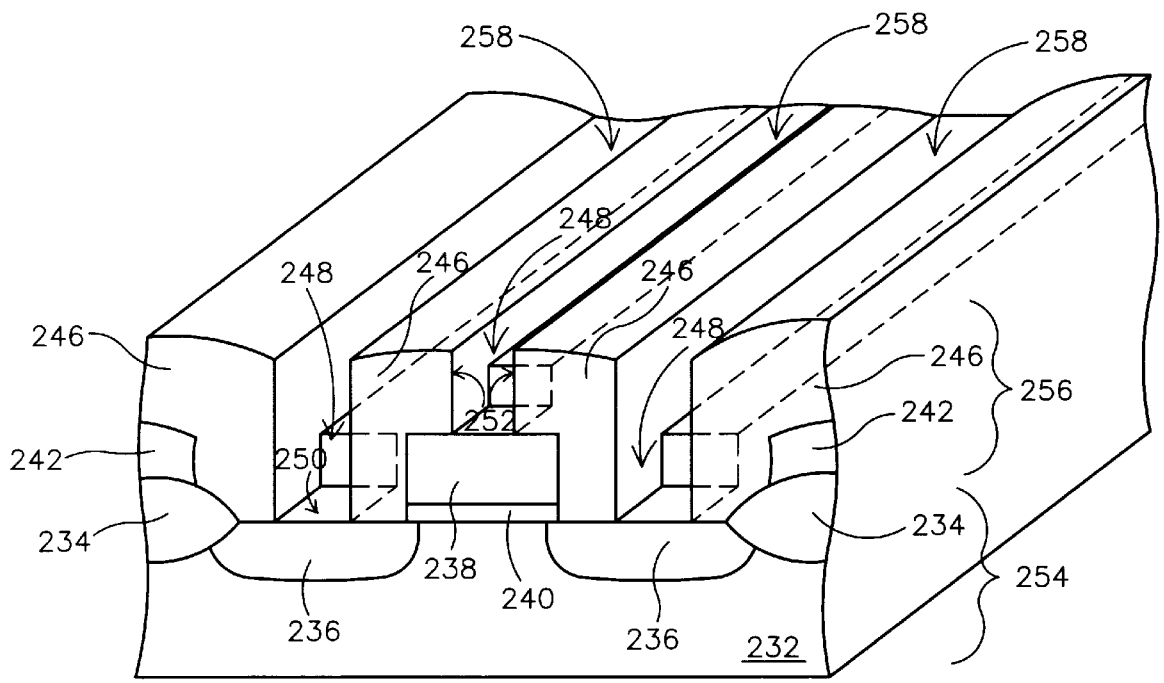
FIG. 2D is a perspective cross-sectional representation of the structure of FIG. 2C, wherein contact holes and trenches are defined in the foamed polymeric material.

As illustrated in FIG. 2D, contact holes 248 are defined to active areas 236 and 238 of the transistor. Optionally, barrier materials, such as titanium nitride or titanium silicide, can be formed on the bottom 250 and/or sidewalls 252 of the contact holes 248. Techniques for forming such materials are well known to one of ordinary skill in the art. For simplicity, such barrier materials are not illustrated in FIG. 2D. At this point it is convenient to point out the device level 254 of the substrate underlying the metallization level 256 of the substrate. In the metallization level 256 of the substrate, trenches 258 are defined in the foamed polymeric material 246. Trenches 258 extend over the contact holes 248 and define the position and width of metal lines that are subsequently formed therein.

To form the contact holes 248 and trenches 258, the structure illustrated in FIG. 2C is patterned using conventional photolithography and etching. Such steps are described previously with respect to FIGS. 1C–1F. Due to the nature of the dual damascene process, the depth of the etch is variable across the surface of the substrate, e.g., the etch depth is greater where contact holes 248 are defined and less where only trenches 258 are defined between devices. Thus, two mask and etch steps can be utilized in a conventional photolithographic process to define the contact holes 248 separately from the trenches 258. Alternatively, a gray mask pattern can be utilized to define the contact holes 248 and trenches 258 simultaneously in one photolithographic mask and etch step.

Figure 2E:
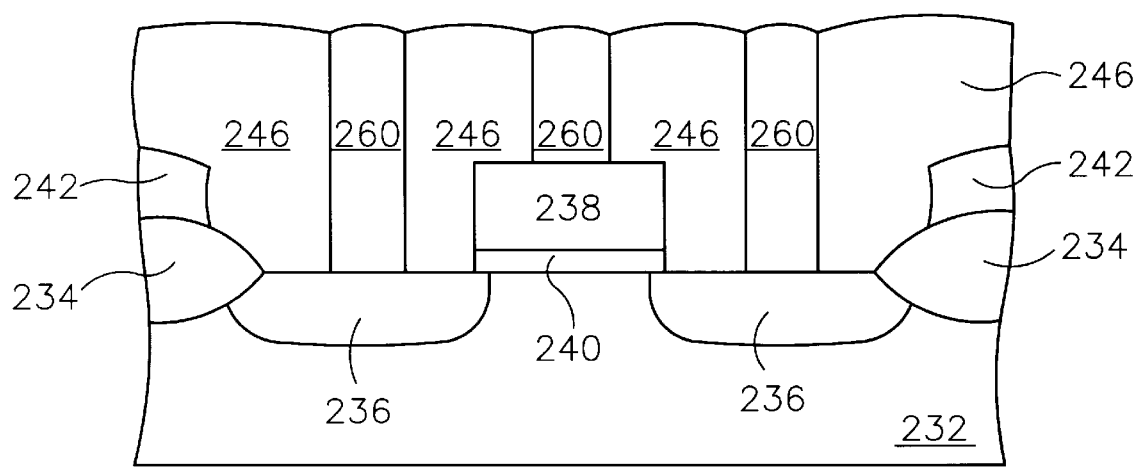
FIG. 2E is a cross-sectional representation of the structure of FIG. 2D, wherein the contact holes and trenches are filled with metal to form the metallization level of the substrate.

Next, as illustrated in FIG. 2E, metal 260 is deposited and etched back in the contact holes 248 and trenches 258. Typically, the metal 260 is aluminum (Al) or an aluminum alloy. Preferable aluminum alloys include Al/Cu and Al/Cu/Si alloys. A wide variety of suitable methods are available for depositing the metal 260. Most techniques are physical techniques (e.g., sputtering and evaporating). The advantage of a dual damascene process is that only one metal 260 deposition step is needed to fill both the contact holes 248 and trenches 258. Excess metal 260 deposited outside of the defined contact holes 248 and trenches 258 is etched back using any suitable method. For example, planarization (e.g., using at least one of a chemical or mechanical technique) is one useful method. The sequence of steps illustrated in FIGS. 2B–2E is then repeated, if necessary, depending on the number of conductive layers in the metallization level of the substrate.

Figure 3:
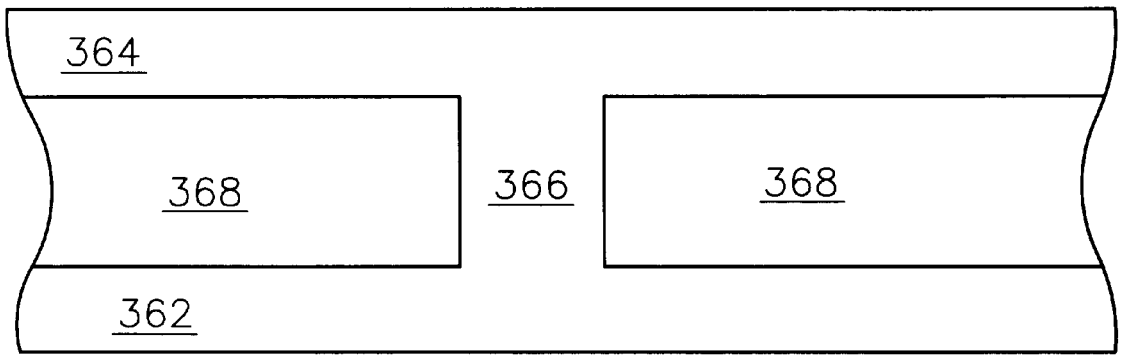
FIG. 3 is a cross-sectional representation of a metallization level of an integrated circuit utilizing foamed insulating material in accordance with the present invention.

FIG. 3 illustrates, in general, one embodiment of part of a metallization level of an integrated circuit. A first conductive layer 362 (e.g., metal line) is electrically connected to a second conductive layer 364 (e.g., metal line) with a conductive via 366. Foamed insulating material 368 in accordance with the present invention electrically insulates the first and second conductive layers 362 and 364. The process utilized to form the structure illustrated in FIG. 3 is readily apparent given the preceding examples. This structure can be formed utilizing dual damascene techniques or standard processing techniques. Details of these processes will not be further recited here.

Figure 4:
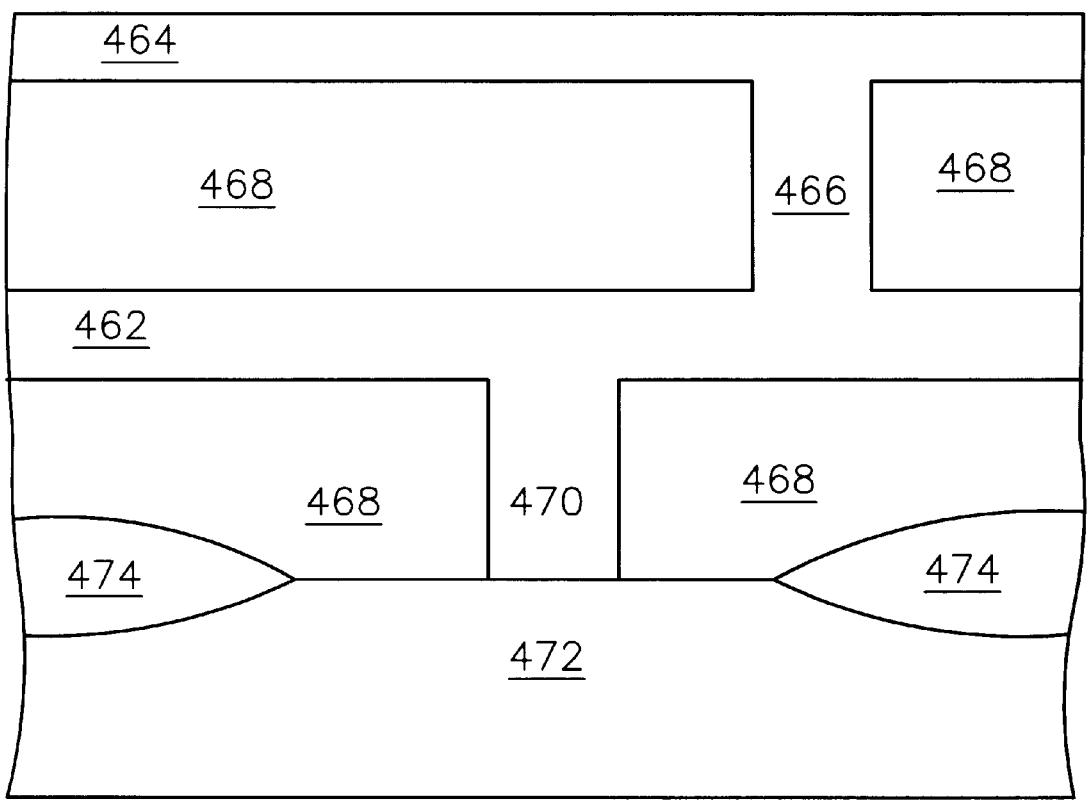
FIG. 4 is a cross-sectional representation of another embodiment of a metallization level of an integrated circuit utilizing foamed insulating material in accordance with the present invention.

FIG. 4 illustrates another embodiment of a metallization level of an integrated circuit. A first conductive layer 462 is electrically connected to a second conductive layer 464 with a conductive via 466. Note that the via 466 is not coincident with the contact 470 to the underlying device. Alternatively, the via 466 can be formed coincidentally with the contact 470 to the underlying device. Foamed insulating material 468 in accordance with the present invention electrically insulates the first and second conductive layers 462 and 464. Foamed insulating material 468 also electrically insulates the first conductive layer 462 from an active area, represented generally as 472, of an underlying substrate. Device level insulation 474 can be silicon dioxide or foamed insulating material of the present invention if processing temperatures permit. This structure can for formed utilizing dual damascene techniques or standard processing techniques. Details of these processes will not be further recited here.

Figure 5:
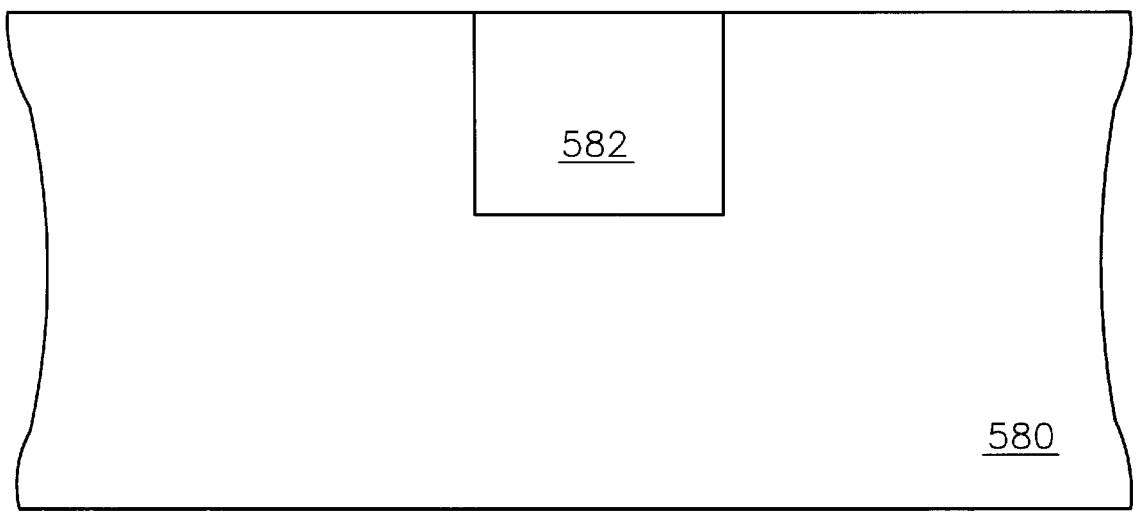
FIG. 5 is a cross-sectional representation of trench isolation utilizing foamed insulating material in accordance with the present invention.

FIG. 5 illustrates trench isolation in general and in accordance with the present invention. A trench is etched in a substrate 580 utilizing conventional processing. Foamed insulating material 582 is then formed in the trench etched in the substrate 580. This process is applicable to both shallow trench isolation and deep trench isolation. Processing times will vary between the two types of trench isolation, however. For deep trench isolation, longer exposure to the supercritical fluid may be necessary to adequately convert substantially all of the polymeric material to the foamed polymeric material. Thus, efficient use of this process may be limited for deep trench isolation, depending on the device density of the integrated circuit in which it is utilized.

All patents disclosed herein are incorporated by reference in their entirety, as if individually incorporated. The foregoing detailed description and examples have been given for clarity of understanding only. No unnecessary limitations are to be understood therefrom. The invention is not limited to the exact details shown and described, as variations obvious to one skilled in the art will be included within the invention defined by the claims. For example, the foamed polymeric material of the present invention can be utilized as an interlayer dielectric insulating material where the metal lines are formed by a variety of methods. This includes single damascene metallization and conventional (i.e., non-damascene) metallization techniques. Furthermore, the foamed polymeric material can be utilized anywhere an electrical insulation material is needed, so long as the polymeric material is stable at the temperatures that it will subsequently be subjected to. For example, the foamed polymeric material can be formed adjacent a conductive layer. A wide variety of other uses are also suitable for use of the present invention. For example, the present invention is also suitable for forming capacitors having a foamed insulating material dielectric layer therein.

It is not necessary that all polymeric insulating material within an integrated circuit by converted to foamed insulating material in accordance with the present invention. It is only necessary to convert a portion of the polymeric material to the foamed polymeric material to obtain the benefits of the present invention. Furthermore, foamed polymeric material of the present invention can be utilized in conjunction with other insulating material. For example, adjacent layers of foamed polymeric material and silicon dioxide insulating material can be utilized in regions of an integrated circuit where different electrical isolation is desired.

What is claimed is:

1. A method of forming an insulating material for use in an integrated circuit, the method comprising the steps of:
   providing a substrate of the integrated circuit;
   forming a polymeric material on the substrate; and
   converting at least a portion of the polymeric material formed on the substrate to a foamed polymeric material, wherein the step of converting the polymeric material comprises exposing at least a portion of the polymeric material to a supercritical fluid.

2. The method of claim 1, wherein the step of forming the polymeric material on the substrate comprises forming a polymeric material selected from the group of an organic polymer, an organic oligomer, and an organic monomer.

3. The method of claim 2, wherein the step of forming the polymeric material on the substrate comprises forming an organic polymer selected from the group of a polyimide, a fluorinated polymer, and a parylene.

4. The method of claim 3, wherein the step of forming the polymeric material comprises forming a polymeric material selected from the group of Type I polyimide, Type III polyimide, and Type V polyimide.

5. The method of claim 4, wherein the step of forming the polymeric material comprises forming a Type I polyimide.

6. The method of claim 4, wherein the step of forming the polymeric material comprises forming a fluorinated polyimide.

7. The method of claim 6, wherein the step of forming the polymeric material comprises forming a fluorinated Type I polyimide.

8. The method of claim 1, wherein the supercritical fluid is carbon dioxide.

9. The method of claim 8, wherein the step of converting the polymeric material comprises converting at least a portion of the polymeric material to a foamed polymeric material having a maximum cell size of less than about 1.0 micron.

10. The method of claim 9, wherein the step of converting the polymeric material comprises converting the polymeric material to a foamed polymeric material having a maximum cell size of less than about 0.1 micron.

11. The method of claim 1, wherein the converting step includes saturating the polymeric material with the supercritical fluid at or above the critical pressure and critical temperature for the supercritical fluid in a process chamber, and thereafter depressurizing the process chamber.

12. The method of claim 1, wherein the step of converting the polymeric material comprises converting at least a portion of the polymeric material to a foamed polymeric material having a maximum cell size of less than about 3.0 microns.

13. The method of claim 1, the method further comprising the step of forming a conductive layer adjacent the foamed polymeric material.

14. The method of claim 13, wherein the step of forming a conductive layer adjacent the foamed polymeric material comprises forming a metal line on the foamed polymeric material.

15. The method of claim 13, wherein the step of forming a conductive layer adjacent the foamed polymeric material comprises forming an interconnect selected from the group of a contact and a via adjacent the foamed polymeric material.

16. The method of claim 1, the method further comprising the steps of:
   patterning the foamed polymeric material resulting in exposed portions of the foamed polymeric material; and
   etching the exposed foamed polymeric material to form a patterned foamed polymeric layer.

17. The method of claim 16, wherein the etching step comprises using an oxygen plasma to etch the exposed foamed polymeric material.

18. A method of fabricating an interconnect for an integrated circuit, the method comprising the steps of:
   providing a substrate that includes an active area of the integrated circuit;
   forming a polymeric material on the substrate;
   converting at least a portion of the polymeric material formed on the substrate to a foamed polymeric material, wherein the step of converting the polymeric material comprises exposing at least a portion of the polymeric material to a supercritical fluid;
   defining at least one contact hole in the foamed polymeric material to the active area of the integrated circuit; and
   filling the contact hole with a conductive material.

19. The method of claim 18, wherein the step of forming a polymeric material on the substrate comprises forming a polyimide on the substrate.

20. The method of claim 18, the method further comprising the step of defining at least one trench in the foamed polymeric material, wherein at least a portion of the at least one trench is adjacent to at least a portion of the at least one contact hole, and further wherein the filling step includes filling the at least one contact hole and the at least one trench with the conductive material.

21. A method of fabricating an interconnect for an integrated circuit, the method comprising the steps of:

providing a substrate that includes a conductive layer;

forming a polymeric material on the conductive layer;

converting at least a portion of the polymeric material formed on the conductive layer to a foamed polymeric material, wherein the step of converting the polymeric material comprises exposing at least a portion of the polymeric material to a supercritical fluid;

defining at least one via in the foamed polymeric material; and filling the via with a conductive material.

22. The method of claim 21, wherein the step of forming a polymeric material on the substrate comprises forming a polyimide on the substrate.

23. The method of claim 21, the method further comprising the step of defining at least one trench in the foamed polymeric material, wherein at least a portion of the at least one trench is adjacent to at least a portion of the at least one via, and further wherein the filling step includes filling the at least one via and the at least one trench with the conductive material.

24. A method of forming an insulating material for use in an integrated circuit, the method comprising the steps of:

providing a substrate of the integrated circuit;

forming a layer of Type I polyimide on the substrate; and converting at least a portion of the Type I polyimide formed on the substrate to a foamed Type I polyimide, wherein the step of converting to a foamed Type I polyimide comprises exposing the Type I polyimide to a supercritical fluid.

25. The method of claim 24, wherein the step of forming the Type I polyimide comprises forming a Type I polyimide having a thickness of about 0.1 microns to about 1.0 microns and wherein the step of converting the Type I polyimide comprises converting to a foamed Type I polyimide having a thickness of about 0.2 microns to about 10 microns.

26. The method of claim 24, wherein the step of converting to a foamed polymeric material comprises exposing the Type I polyimide to supercritical carbon dioxide.

27. The method of claim 24, wherein the method further comprises the steps of patterning the foamed Type I polyimide and etching at least one of a contact hole, a via, or a trench in the foamed Type I polyimide.

28. The method of claim 27, the method further comprising the step of depositing a metal in the at least one of the contact hole, the via, or the trench.

29. The method of claim 24, wherein the step of converting to a foamed polymeric material comprises converting to a foamed polymeric material having a cell size of less than about 0.1 micron.

30. A method of forming an insulating material for use in an integrated circuit, the method comprising the steps of:

providing a substrate of the integrated circuit;

forming a layer of fluorinated polymer on the substrate; and converting at least a portion of the fluorinated polymer formed on the substrate to a foamed fluorinated polymer, wherein the step of converting to a foamed fluorinated polymer comprises exposing the fluorinated polymer to a supercritical fluid.

31. The method of claim 30, wherein the step of forming a layer of fluorinated polymer includes forming a layer of a fluorinated polyimide.

32. The method of claim 31, wherein the step of forming a layer of fluorinated polyimide includes forming a layer of a fluorinated Type I polyimide.

* * * * *